United States Patent
Kashihara et al.

Patent Number: 5,572,052
Date of Patent: Nov. 5, 1996

[54] ELECTRONIC DEVICE USING ZIRCONATE TITANATE AND BARIUM TITANATE FERROELECTRICS IN INSULATING LAYER

[75] Inventors: Keiichiro Kashihara; Tomonori Okudaira; Hiromi Itoh, all of Hyogo, Japan

[73] Assignee: Mitsubishi Denki Kabushiki Kaisha, Tokyo, Japan

[21] Appl. No.: 374,890

[22] Filed: Jan. 19, 1995

Related U.S. Application Data

[63] Continuation of Ser. No. 93,671, Jul. 20, 1993, abandoned.

[30] Foreign Application Priority Data

| Jul. 24, 1992 | [JP] | Japan | 4-198080 |
| Apr. 28, 1993 | [JP] | Japan | 5-102511 |
| Apr. 30, 1993 | [JP] | Japan | 5-104146 |

[51] Int. Cl.[6] .................... H01L 29/94; H01G 4/20; H01G 4/06; G11C 11/22
[52] U.S. Cl. .................... 257/295; 365/145; 365/149; 361/312; 361/313; 361/322
[58] Field of Search ............ 257/295; 365/145, 365/149; 361/312, 313, 322

[56] References Cited

U.S. PATENT DOCUMENTS

| 4,437,139 | 3/1984  | Howard         | 361/313 |
| 4,727,004 | 2/1988  | Tanaka et al.  | 428/690 |
| 4,873,610 | 10/1989 | Shimizu et al. | 361/313 |
| 5,046,043 | 9/1991  | Miller et al.  | 365/145 |
| 5,198,269 | 3/1993  | Swartz et al.  | 427/226 |
| 5,248,564 | 9/1993  | Kamesh         | 257/295 |
| 5,326,721 | 7/1994  | Summerfelt     | 437/131 |
| 5,338,951 | 8/1994  | Argos, Jr. et al. | 257/295 |

FOREIGN PATENT DOCUMENTS

| 59-42392 | 3/1984 | Japan . | |
| 2-6335 | 1/1990 | Japan . | |
| 5-9738 | 1/1993 | Japan . | |
| 91-13465 | 9/1991 | WIPO | 257/295 |

OTHER PUBLICATIONS

"Preparation of $PbTiO_3$ Thin Films by MOCVD Under Atmospheric Pressure", by Masaru Okada et al, Technical Paper of the Ceramics Society of Japan 96 (6), pp. 687–693, 1988. (no translation except 93 abstract).

"Metalorganic Chemical Vapor Deposition of c–Axis Oriented PZT Thin Films", by Masaru Okada, Japanese Journal of Applied Physics Vo., 29, No. 4, pp. 718–722, Apr. 1990.

"Barrier Layers for Realizationof High Capacitance Density in $SrTiO_3$ Thin–Film Capacitor on Silicon", by Toshiyuki Sakuma et al, Appl. Phys. Lett. 57 (23), pp. 2431–2433. Dec. 3, 1990.

"Formation of Epitaxial $Pb(Zr\ Ti)O_3$ Film by CVD", by Hiroshi Funakubo et al, Technical Paper of the Ceramics Society of Japan 99 (3), pp. 248–250, 1991.

Primary Examiner—Sara W. Crane
Assistant Examiner—Alice W. Tang
Attorney, Agent, or Firm—Lowe, Price, LeBlanc & Becker

[57] ABSTRACT

In an electronic device using lead zirconate titanate (PZT) or lanthanum lead zirconate titanate (PLZT) as the main insulating material, a PZT film or a PLZT film is formed on a sub-insulating layer consisting essentially of lead titanate, lanthanum lead titanate, barium titanate, strontium titanate, barium strontium titanate, lead zirconate, or lanthanum lead zirconate. In an MIS structure, a semiconductor, the sub-insulating layer, the PZT film and metal are deposited in order. In a capacitor, the sub-insulating layer and the PZT film are sandwiched between a pair of electrodes. The sub-insulating layer improves crystallinity of PZT or PLZT, and the dielectric constant. An oxide of Pb, La, Zr or Ti can be added as the sub-insulating layer in order to further suppress current leakage.

3 Claims, 12 Drawing Sheets

FIG.7
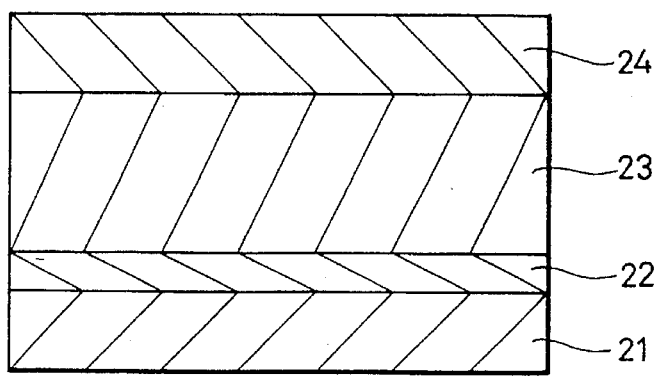
FIG.8
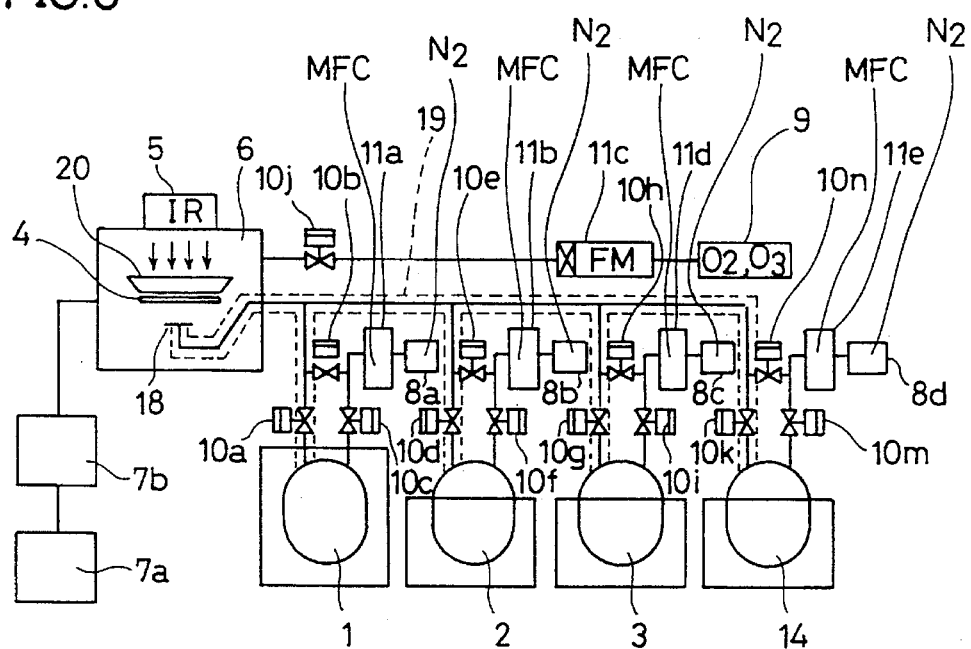
FIG.9

ELECTRONIC DEVICE USING ZIRCONATE TITANATE AND BARIUM TITANATE FERROELECTRICS IN INSULATING LAYER

This application is a continuation of application Ser. No. 08/093,671 filed Jul. 20, 1993, now abandoned.

BACKGROUND OF THE INVENTION

1. Field of the Invention

The present invention relates to semiconductor devices such as DRAMs and nonvolatile RAMs, and piezoelectric, pyroelectric and optoelectric devices using ferroelectric ceramics such as lead zirconate titanate (PZT) or lanthanum lead zirconate titanate (PLZT) in an insulating layer, and a method of manufacturing the same.

2. Description of the Background Art

Ferroelectric ceramics such as $PbTiO_3$, PZT and PLZT are utilized in piezoelectric, pyroelectric and optoelectric devices and the like. The application thereof ranges widely over the fields of oscillators, filters, infrared sensors and the like.

In recent years, attention is directed to ferromagnetic ceramics as a dielectric material for forming the capacitance of DRAMs and nonvolatile RAMs. These ceramics have applicability to nonvolatile semiconductor memories due to the fact that once voltage is applied utilizing ferroelectricity, the data can be maintained even if the voltage is removed. The potential of these materials for application to memory cells in semiconductor memory devices of high density is great since ferroelectric ceramics with significant high dielectric constant can store a great amount of charge even in capacitors having high integration density and small electrode area.

FIG. 1 shows a conventional DRAM using ferroelectric ceramics as the dielectric of a stacked type capacitor. Referring to FIG. 1, the conventional DRAM has an isolation oxide film 132 for element isolation formed at a predetermined region on the main surface of a silicon semiconductor substrate 131. A channel stopper layer 133 is formed beneath isolation oxide film 132. In the region surrounded by isolation oxide film 132, source/drain regions 134 and 135 with a predetermined distance therebetween are formed so as to sandwich a channel region 136. A gate electrode 138 is formed on channel region 136 with a gate insulating film 137 therebetween. An insulating film 139 is formed so as to cover gate electrode 138. A buried bit line 140 electrically connected to source/drain region 134 is formed so as to extend along the surface of insulating film 139. An interlayer insulating film 141 having a contact hole 141a is formed on source/drain region 135. An interconnection layer 142 of polysilicon is formed in contact hole 141a so as to electrically connect source/drain region 135. A platinum layer 143 is formed on interconnection layer 142 and extending above interlayer insulating film 141. A ferroelectric film 144 such as of PZT or PLZT is formed on platinum layer 143. A capacitor upper electrode 145 such as of platinum is formed on ferroelectric film 144. An interlayer insulating film 146 having a contact hole 146a is formed on capacitor upper electrode 145. An interconnection layer 147 is formed so as to extend on interlayer insulating film 146 and to be electrically connected to capacitor upper electrode 145. In such a structure, a capacitor lower electrode is formed of interconnection layer 142 and platinum layer 143.

FIG. 2 shows the hysterisis characteristics of a capacitor using ferroelectric ceramics. When a voltage of Vcc/2 or −Vcc/2 is once applied across the electrodes of the capacitor, charge of Qr or −Qr can be stored even after the voltage is removed.

A possible consideration is that the ferroelectric ceramics can be substituted by the gate oxide film of a MOS field effect transistor (FET). For example, in the FET shown in FIG. 3, a gate insulating film 110 is formed of ferroelectric ceramics to form the circuit shown in FIG. 4. When a voltage signal shown in FIG. 5 (A) is applied to the IN terminal of the circuit shown in FIG. 4, it is expected that a voltage signal as shown in FIG. 5 (B) appears. More specifically, when a positive or negative voltage is once applied to the gate electrode, the FET is switched ON/OFF, whereby data can be maintained even after voltage is removed. Such a device is called a MFSFET (Metal-Ferroelectric-Semiconductor FET) with potential of applicability to a nonvolatile semiconductor memory device.

In application of ferroelectric ceramics to the above-described electric devices, a technique for forming a thin film of ferroelectric ceramics is indispensable. A sputtering method has conventionally being employed in formation of such a thin film. This method, however, has disadvantages such as low deposition rate, generation of surface defects, and difficulties in stoichiometric control in films.

Japanese Patent Laying-Open No. 59-42392 discloses a method of forming a precursor of ferroelectric ceramics including lead in a liquid phase. In this method, a compound represented by a general formula of $Pb(OCOR)_2$ is used as a source material of Pb, and zirconium alkoxide and titanium alkoxide are used as the source materials of zirconium and titanium, respectively. When these source materials are heated and mixed together, a precursor of ceramics is produced. By applying an organic solvent solution of the precursor to a substrate, followed by a heating step, a thin film of ceramics is produced.

Japanese Patent Laying-Open No. 2-6335 discloses a method of forming a thin film of PZT by means of a sol-gel method. According to this method, a mixture consisting essentially of lead alkoxide or lead acetate, zirconium alkoxide, titanium alkoxide, ethanolamine and alcohol is applied onto a substrate and then dried to form a gel. By sintering the gelled mixture, a PZT thin film is produced on the substrate. Such a liquid phase method has the advantage of easy manipulation and allows stoichiometric control of a film. Moreover, the film thickness can be varied by changing the concentration of the mixture to be applied on the substrate or the number of times the mixture is applied. However, this method has the disadvantage of difficulty in forming a relatively thin film (for example, a thickness less than 2000 Å). Furthermore, an adequate step coverage may not be achieved, resulting in a rough surface of deposited layers.

A chemical vapor deposition (CVD) method is effective for solving the above-described disadvantages. For example, the formation of a $PbTiO_3$ thin film has been reported (Technical Papers of the Ceramics Society of Japan 96 [6] 687-93 (1988)) by a MOCVD method using an organometal compound as a source material. According to this method, tetraethyl lead (referred to as PbEt hereinafter) and titanium isopropoxide (referred to as i-POT hereinafter) were used as the source materials of Pb and Ti, respectively. As a substrate for precipitation of a dielectric thin film, monocrystals of mirror polished Si (100), sapphire (0001) and MgO (100) were used. FIG. 6 schematically shows the reported CVD device. i-POT and PbEt stored in bubblers 91 and 92, respectively, were introduced into a reaction chamber 97 by $N_2$ carrier gas via a pipe 93b heated by a ribbon heater 93a.

Reaction chamber 97 was evacuated by a rotary pump 96. The mixed source gas was blown from a nozzle 98 onto a substrate 94 heated by a heater 95. A PbTiO$_3$ film was obtained at the substrate temperature of 500° C.–600° C.

The formation of a PZT thin film using a MOCVD method similar to the above-described method has also been reported (Japanese Journal of Applied Physics Vol. 29, No. 4, April 1990, pp. 718–722). According to this method, zirconium tetraisopropoxide (referred to as POZ hereinafter) or zirconium tetra-dipivaloylmethane (referred to as Zr (DPM)$_4$ hereinafter) was employed as a source material of zirconium besides the above-described source materials of Pb and Ti. As source material systems, two systems of PbET-POZ-POT and PbET-Zr(DPM)$_4$-POT were tested. As a substrate for forming a PZT thin film, monocrystals of mirror polished Si (100) and MgO (100) were used. In the respective types, the three source materials were carried and mixed by a carrier gas at the rate of 40–100 ml/min. In response to the mixed source gas on the substrate heated to a temperature of 500° C.–650° C., a PZT thin film was generated on the substrate at a deposition rate of 100–1000 Å/min.

Furthermore, formation of a PZT thin film by a CVD method has been reported using a material different from those in the above-described methods (Technical Papers of the Ceramics Society of Japan 99 [3] 248–250 (1991)). According to this report, dipivaloylmethanato lead (Pb(DPM)$_2$), titanium tetraisopropoxide (Ti (O—i—C$_3$H$_7$)$_4$), and zirconium tetra tert-butoxide (Zr(O—t—C$_4$H$_9$)$_4$) were used as the source materials of Pb, Ti, and Zr, respectively. As a substrate for depositing a PZT thin film, a monocrystal of MgO (100) was used. The temperatures for vaporization of the source materials were 165° C., 50° C., and 42° C. for Pb, Zr and Ti, respectively. The source material of Pb was carried by N$_2$ carrier gas at the rate of 180 ml/min. The source materials of Zr and Ti were carried out by N$_2$ carrier gas respectively at the rate of 40 ml/min. The vapor of the source materials were mixed with O$_2$ supplied at the rate of 40 ml/min., to be admitted into a CVD reaction chamber. In the CVD reaction chamber, a PZT thin film was formed on a MgO monocrystalline substrate heated to the temperature of 700° C. under the pressure of 20 Torr. According to the above-described MOCVD method, a relatively thin ferroelectric ceramic film having a smooth surface can be formed at a higher deposition rate with controllability of the stoichiometric composition of the film.

In the above described method, epitaxial growth was carried out on a monocrystalline substrate such as MgO (100) and sapphire (0001). Such an epitaxial growth allows formation of a ceramic thin film with high crystallinity and dielectric constant on a substrate. However, the usage of a monocrystalline material for the formation of a ceramic thin film is not practical in the manufacture of an electronic device. When PZT or PLZT is applied to an electronic device, noble metal having a relatively high melting point such as platinum is used for an electrode in the capacitor structure. This electrode of noble metal is generally polycrystalline. If a ferroelectric ceramic layer is to be formed on a polycrystalline electrode directly employing the above-described method, a layer of appropriate crystallinity cannot easily be obtained. PZT and PLZT are materials indicating perovskite type crystal structure differing greatly in electric characteristic, particularly dielectric constant depending upon its crystallinity. In the above-described method, a PZT or PLZT film formed directly on a polycrystal such as platinum had poor crystallinity and low dielectric constant. When CVD method was used, excessive growth of the crystal was seen to result in large grain size, so that the morphology of the surface was degraded. A uniform and small grain size was required.

Those including Zr greater in amount than Ti in PZT is considered to be particularly suitable as the material of a capacitor insulating film of a DRAM due to the fact that it can suppress leakage current. When a PZT film is to be formed on platinum under the condition of supplying a greater amount of zirconium source in the above-described CVD in order to obtain such a Zr rich material, zirconium oxide (ZrO$_2$) is easily precipitated. Under such conditions, a PZT of uniform perovskite crystal phase could not be obtained. This means that a PZT film of a satisfactory level of dielectric constant cannot be obtained.

In the above-described FET, a gate insulating film must be formed of a material exhibiting ferroelectricity at ordinary temperature. In accordance with a sol-gel method, sputtering method, or a CVD method, a monocrystalline substrate of sapphire (0001) and MgO (100) allows production of a PZT or PLZT film having appropriate crystallinity and exhibiting ferrolectricity at ordinary temperature. A PLZT film having crystallinity of some degree can be formed even on a platinum monocrystalline substrate. However, when a PZT film or a PLZT film is formed directly on a semiconductor substrate, particularly a Si substrate, a film cannot easily be obtained that has appropriate crystallinity and ferroelectricity. Therefore, it is difficult to apply sufficient characteristics to a device by an amorphous PZT film or PLZT film.

A PZT of appropriate crystallinity has a dielectric constant of at least 1000. This is a very high value in comparison with silicon dioxide (dielectric constant 3.8) and silicon nitride (dielectric constant 7.4) often used in current semiconductor memory devices. The potential of PZT as the capacitor dielectric material in semiconductor memory devices, particularly DRAMs of high integration density is great.

However, application of PZT to an electronic device had a problem set forth in the following. In a semiconductor device having a structure as shown in FIG. 4, a capacitor having a structure sandwiching PZT between a pair of electrodes is likely to have a leakage current density greater than practical usage level. This means that the consumption power of the device is increased.

SUMMARY OF THE INVENTION

In an electronic device having an insulating layer consisting essentially of zirconate titanate such as PZT and PLZT, an object of the present invention is to improve crystallinity of the insulating layer, providing a layer exhibiting sufficient ferroelectricity at ordinary temperature.

Another object of the present invention is to provide a capacitor structure having a PZT or PLZT layer of superior crystallinity and high dielectric constant.

A further object of the present invention is to provide a film exhibiting sufficient ferroelectricity at ordinary temperature in an electronic device having a MIS (Metal-Insulator-Semiconductor) structure.

Still another object of the present invention is to provide a device, particularly a MFSFET, having a MFS structure of practical usage.

A still further object of the present invention is to suppress leakage of current in an electronic device having an insulating layer using zirconate titanate such as PZT and PLZT.

According to an aspect of the present invention, an electronic device includes a first layer consisting essentially of a conductor or a semiconductor, an insulating layer formed on the first layer, and a second layer formed on the insulating layer and consisting essentially of conductor, wherein the insulating layer includes a sub-insulating layer consisting essentially of lead titanate, lanthanum lead titanate, barium titanate, strontium titanate, barium strontium titanate, lead zirconate, and lanthanum lead zirconate, or a combination thereof, and a main insulating layer formed on the sub-insulating layer and consisting essentially of zirconate titanate. The main insulating layer has a perovskite type crystal structure, and exhibits ferroelectricity at normal temperature.

According to another aspect of the present invention, a method of manufacturing an electronic device includes the steps of preparing a first layer, forming an insulating layer on the first layer, and forming a second layer on the insulating layer, wherein the step of forming an insulating layer on the first layer includes the steps of forming the sub-insulating layer, and a main insulating layer consisting essentially of zirconate titanate on the sub-insulating layer. The sub-insulating layer and the main insulating layer can respectively be formed by sol-gel method, sputtering, or CVD.

According to a further aspect of the present invention, an electronic device includes a pair of electrodes, a main insulating layer formed between the pair of electrodes and consisting essentially of zirconate titanate, and a sub-insulating layer provided between the main insulating layer and at least one of the pair of electrodes, and consisting essentially of an oxide of at least any metal selected from the group consisting of Pb, La, Zr and Ti.

According to still another aspect of the present invention, a method of manufacturing an electronic device includes the steps of preparing an electrode layer consisting essentially of metal, forming a main insulating layer consisting essentially of zirconate titanate on or above the electrode layer, forming on the main insulating layer a sub-insulating layer of an oxide of at least any metal selected from the group consisting of Pb, La, Zr and Ti, and forming an electrode layer on the sub-insulating layer. The main insulating layer and the sub-insulating layer can be formed respectively by sol-gel method, sputtering, or CVD.

In the present specification, a main insulating layer refers to an insulating layer providing the main characteristics as an insulator, and a sub-insulating layer refers to a layer that assists the main insulating layer and contributes to characteristics as an insulator together with the main insulating layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a sectional view of a capacitor structure of an electronic device according to the present invention.

FIG. 8 schematically shows a CVD device for manufacturing an insulating layer according to the present invention.

FIG. 9 is a sectional view of a capacitor structure of an electronic device according to another embodiment of the present invention.

FIG. 18 (B) shows C-V characteristics where a sub-insulating layer and a main insulating layer are formed on an n type silicon substrate.

DESCRIPTION OF THE PREFERRED EMBODIMENTS

Figure 1:
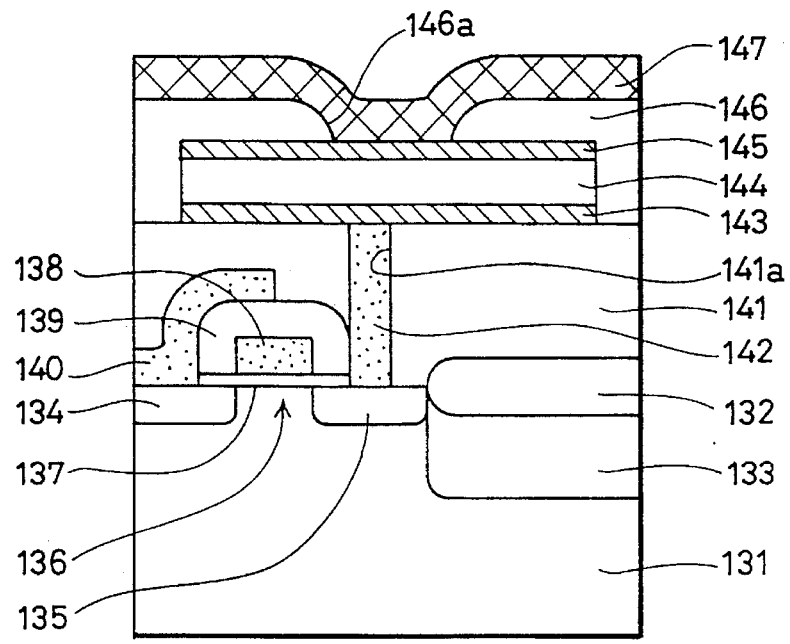
FIG. 1 schematically shows a conventional capacitor portion of a semiconductor memory cell using PZT.
Figure 2:
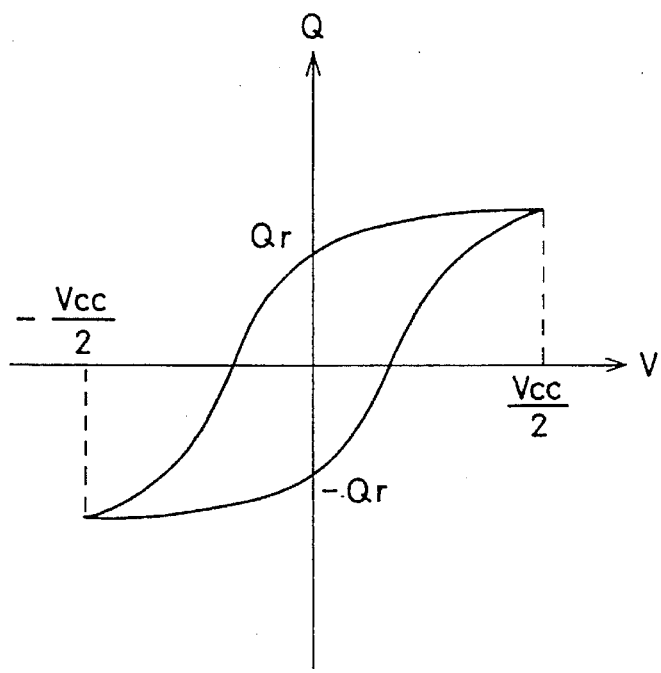
FIG. 2 is a diagram for describing hysterious characteristics of a capacitor using ferroelectric ceramics.
Figure 3:
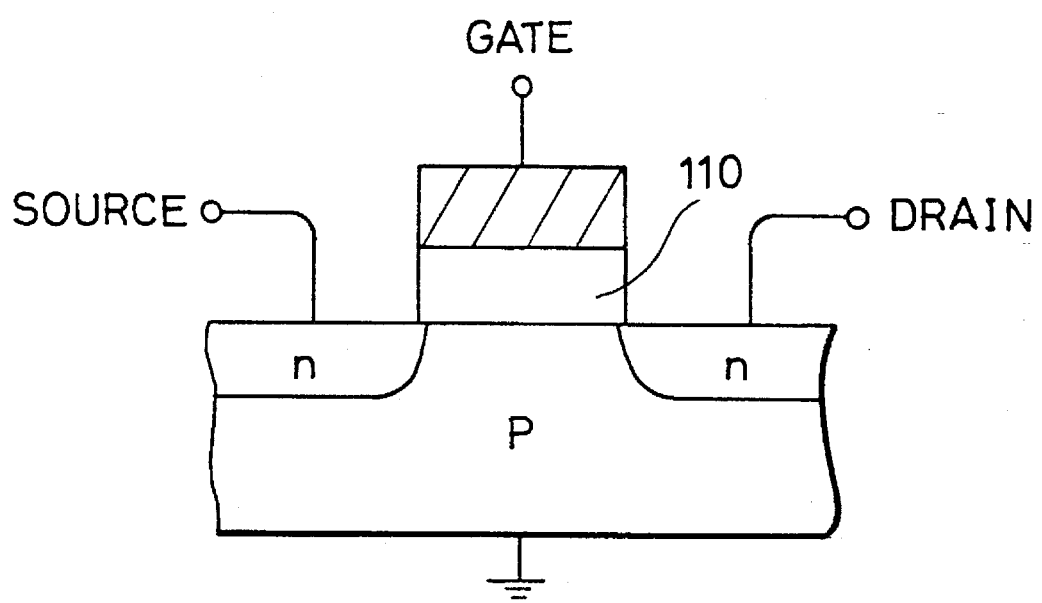
FIG. 3 is a diagram for describing a FET employing ferroelectric ceramics for a gate insulating film.
Figure 4:
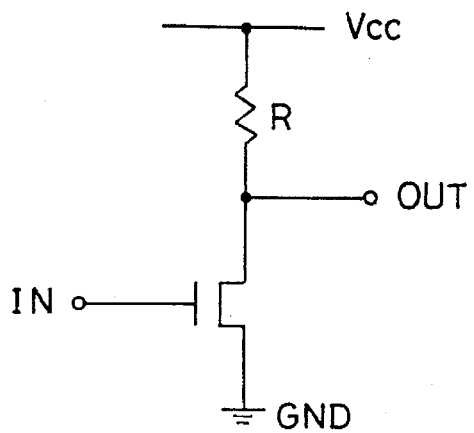
FIG. 4 is a circuit diagram of a FET.
Figure 5A:
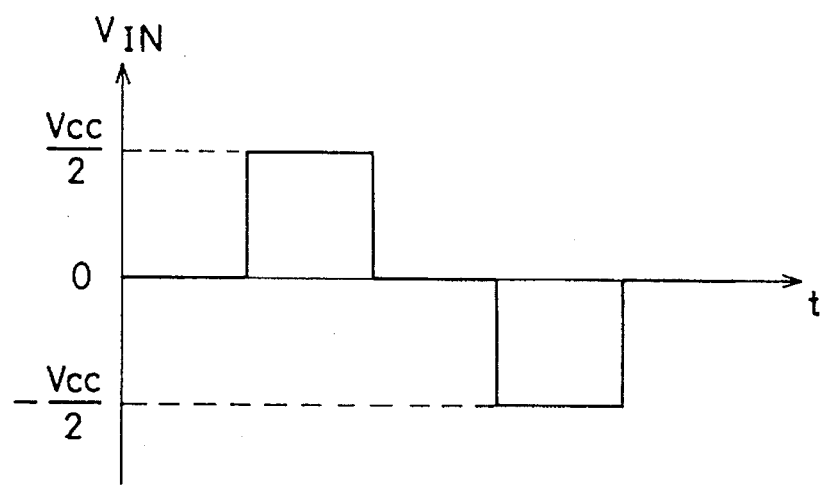
FIGS. 5 (A) and 5 (B) are diagrams describing signal characteristics of a FET employing ferroelectric ceramics as a gate insulating film.
Figure 5B:
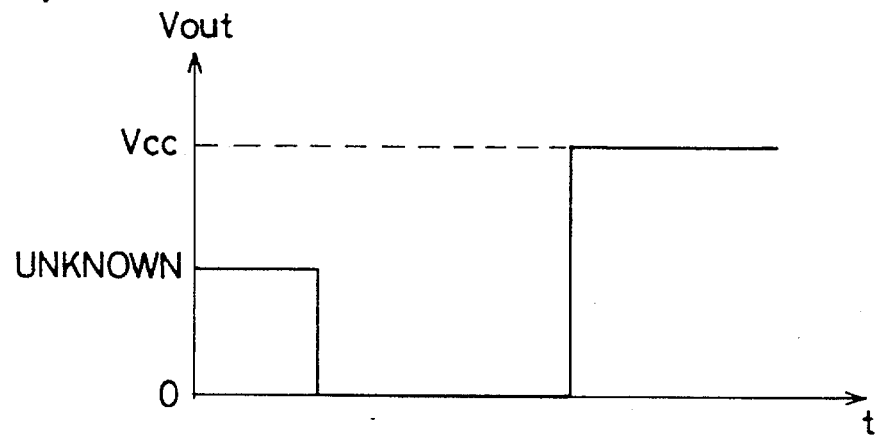
Figure 6:
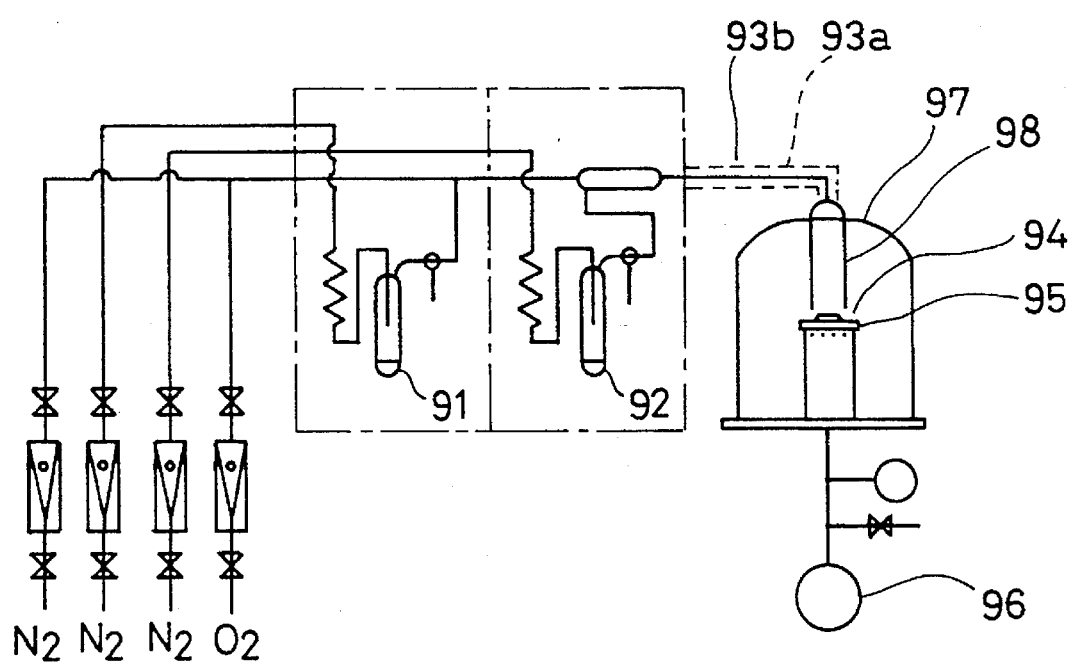
FIG. 6 schematically shows a conventional device used in CVD.

An electronic device having a capacitor structure is provided according to the present invention. A capacitor structure includes a pair of electrodes, a main insulating layer provided between the pair of electrodes and consisting essentially PZT, PLZT, or a combination thereof, and a sub-insulating layer in contact with the main insulating layer and interposed between the main insulating layer and one of the pair of electrodes. The sub-insulating layer is formed preferably of at least one titanate selected from the group consisting of lead titanate ($PbTiO_3$), lanthanum lead titanate ($Pb_xLa_{1-x}TiO_3$ (0< x<1), barium titanate ($BaTiO_3$), strontium titanate ($SrTiO_3$, and barium strontium titanate ($Ba_YSr_{1-Y}TiO_3$ (0<Y<1)). A sub-insulating layer is formed preferably of at least a zirconate selected from the group consisting of lead zirconate ($PbZrO_3$) and lanthanum lead zirconate ($Pb_ZLa_{1-Z}ZrO_3$ (0<Z<1)). The thickness of the sub-insulating layer is set to approximately 100–500 Å for example, preferably approximately 200–300 Å. Titanate or zirconate forms and holds a perovskite type crystal structure on a material constituting an electrode in an easier manner than PZT and PLZT. According to the present invention, because a PZT or PLZT is provided on an electrode via a sub-insulating layer consisting essentially of titanate or zirconate, a main insulating layer having a perovskite type crystal structure and exhibiting high dielectric constant can be formed. PZT or PLZT can provide a perovskite type crystal structure of small and uniform crystal grain size on a sub-insulating film of titanate thereof. The sub-insulating layer provides the effect of suppressing leakage current.

From the standpoint of suppressing leakage current, barium titanate, strontium titanate, or barium strontium titanate is preferably used. In the capacitor structure, one of the pair of electrodes, (for example, the lower electrode) is preferably formed of a noble metal such as platinum, gold, palladium, ruthenium, and rhodium. The other electrode (for example, the upper electrode) can be formed of platinum, titanium nitride, aluminum, tungsten, or a combination thereof. In the capacitor according to the present invention, the main insulating layer consisting essentially of PZT or PLZT has a perovskite type crystal structure. Such an insulating layer is mainly formed of PZT or PLZT polycrystals. In an insulating layer of polycrystalline structure, the average grain size of a crystal is preferably not more than approximately 1000 Å (0.1 μm). The thickness of the insulating layer of PZT or PLZT is set to approximately 1000–2000 Å for example, preferably to the level of approximately 1500 Å.

In forming the above-described capacitor structure, an electrode such as of noble metal, a sub-insulating layer, a main insulating layer, and the other electrode are deposited in order. The sub-insulating layer can be formed by a liquid phase method such as sol-gel method, PVD such as sputtering, or by CVD method such as MOCVD. The sub-insulating layer can be formed to a thickness of approximately 100–500 Å, for example, preferably approximately 200–300 Å by these methods. Similarly, the main insulating layer of PZT or PLZT can be formed by a liquid phase method such as sol-gel, PVD such as sputtering, or by CVD such as MOCVD. The main insulating layer can be formed to a thickness of approximately 1000–2000 Å, for example, preferably approximately 1500 Å.

One of the pair of electrodes (for example the lower electrodes) can preferably be formed of a noble metal having a relatively high melting point such as platinum, gold, palladium, ruthenium, or rhodium. The other of the pair of the electrodes (for example the upper electrode) can be formed of platinum, titanium nitride, aluminum, tungsten or a combination thereof.

According to the present invention, CVD can preferably be used to form an insulating layer. In CVD, a β-diketone complex of Pb can preferably be used as the source material of Pb. The β-diketone complex of Pb can be represented by the following structural formula:

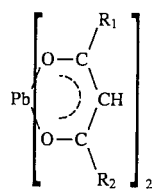

The danger in handling the β-diketone complex Pb is low due to its low toxicity. Because the β-diketone complex Pb has a melting point relatively lower than that of conventional source materials, vaporization can be carried out at a relatively low temperature. The vaporized β-diketone complex of Pb reaches the substrate without almost no decomposition. In view of the foregoing, a β-diketone complex Pb is practical for industrial usage. Favorable examples of a β-diketone complex of Pb include acetylacetonato lead ($R_1=CH_3$, $R_2=CH_3$ in the above formula), dipivaloylmethanato lead ($R_1=C(CH_3)_3$, $R_2=C(CH_3)_3$, in the above formula), heptafluorobutanoylmethanato lead ($R_1=C_3F_7$, $R_2=C(CH_3)_3$ in the above formula), and hexafluoroacetylacetonato lead. If a lower temperature in the CVD process is desired, trimethyl heptanedionato lead (TMHPD) ($R_1=CH(CH_3)_2$, $R_2=C(CH_3)_3$ in the above formula), having a lower melting point (77° C.) may be used.

The Pb source material may have the vapor thereof transported to an environment for CVD by blowing in carrier gas into the heated and melted source material, or by a carrier gas after sublimation of a solid by heating. In these cases, nitrogen gas is generally used as carrier gas. From the standpoint of lowering the temperature in a CVD process, the method of subliming a solid is preferable since the heating temperature is lower. For example, if dipivaloylmethanato lead is used as the Pb source material, heating at a temperature of approximately 165° C. is required to fuse the material. In contrast, sublimation of the solid can be carried out by heating at the temperature of 120° C.–140° C., preferably 135° C.

As a Zr source material, zirconium alkoxide (Zr $(OR)_4$) which is liquid at 25° C. and 1 atm can preferably be used. Zirconium alkoxide can be selected from the group consisting of zirconium methoxide, zirconium ethoxide, zirconium propoxide, and zirconium butoxide, for example. A particularly preferable example of zirconium alkoxide is zirconium tetra tert-butoxide.

As a Ti source material, titanium alkoxide (Ti $(OR')_4$) which is liquid at 25° C. and 1 atm can preferably be used. Titanium alkoxide can be selected from the group consisting of titanium methoxide, titanium ethoxide, titanium propoxide, and titanium butoxide, for example. Tetraisopropoxide is particularly preferable as an example of titanium alkoxide.

As a La source material, a β-diketone complex of La can preferably be used. Tridipivaloylmethanato lanthanum (La $(DPM)_3$) is particularly preferable as a β-diketone complex of La.

Furthermore, as an oxidizing agent of the source material, at least any of oxygen and ozone can be used.

According to the present invention, an insulating layer of PZT or PLZT can preferably be formed by heat CVD using the above-described materials. In this heat CVD step, a substrate is heated to 600°–700° C., for example.

According to a method of manufacturing a capacitor, a sub-insulating layer consisting of at least one compound selected from the group consisting of lead titanate, lanthanum lead titanate, barium titanate, strontium titanate, barium strontium titanate, lead zirconate, and lanthanum lead zirconate is formed on an electrode layer of metal. The sub-insulating layer has a perovskite type crystal structure formed easier than a PZT and PLZT on an electrode. By depositing PZT or PLZT on the sub-insulating layer, a crystal of PZT or PLZT can be grown with the crystal in the sub-insulating layer as a nucleus. Such a formed main insulating layer has a perovskite type crystal structure with fine and uniform crystal grain size. In general, PZT or PLZT can be polycrystalline with a high dielectric constant.

In conventional art, an insulating layer of appropriate crystallinity could not be formed by just forming a PZT or PLZT directly on a polycrystalline metal such as platinum in CVD. In the present invention, by forming on an electrode material an insulating layer of titanate or zirconate that facilitates formation of a perovskite type crystal, a PZT or PLZT layer superior in crystallinity and high in dielectric constant can be obtained.

The sub-insulating layer can be formed of a material identical to that used in the formation of the main insulating layer. When lead titanate is to be formed as the sub-layer, the Pb source material and the Ti source material required in the formation of the main layer in CVD are used. These materials are oxidized and decomposed by oxygen or ozone by a process similar to the CVD step carried out in the formation of the main layer to deposit lead titanate on the substrate. Thus, the formation of the sub-layer and the main later can be carried out with the same material and with the same apparatus. The two insulating layers can be formed in succession.

The present process of forming an insulating layer superior in crystallinity can particularly be applied to the formation of a PZT or PLZT layer including Zr greater in amount. A zirconium rich main insulating layer has a lower leakage current in comparison with a titanium rich insulating layer, and is particularly suitable for a DRAM capacitor.

According to another aspect of the present invention, a capacitor includes a sub-insulating layer consisting essentially of a Pb oxide, a La oxide, a Zr oxide, a Ti oxide, or a combination thereof to suppress leakage current. These oxides are preferable for leakage current suppression from the standpoint of having high resistance. This oxide layer is formed between an electrode and a main insulating layer consisting essentially of PZT or PLZT. The oxide layer is formed by a liquid phase method such as sol-gel, PVD such as sputtering, or CVD such as MOCVD.

An oxide layer, particularly a Zr oxide layer has a low dielectric constant and a high resistance in comparison with those of a PZT and PLZT. Therefore, an oxide layer provided between an electrode and a main insulating layer suppresses the leakage current generated between the main insulating layer and the electrode. The oxide layer effectively prevents increase in the consumption power of the device.

The oxide layer can be formed of a material identical to that used in the formation of the main insulating layer. For example, when a Zr oxide layer is to be formed, a Zr source material required for formation of the main insulating layer by CVD is used to be oxidized and decomposed by oxygen or ozone similar to the CVD in forming the main layer, to evaporate $ZrO_2$ on the substrate. Thus, the formation of the main layer and the oxide layer can be carried out by sharing the same material and with the same apparatus. Therefore, formation of the two layers can be carried out in succession.

According to the present invention, an electronic device having a MIS structure is provided. An insulating layer for a MIS structure includes a sub-insulating layer of at least one titanate selected from the group consisting of strontium titanate ($SrTiO_3$), barium titanate ($BaTiO_3$) and barium strontium titanate ($Ba_xSr_{1-x}TiO_3$) ($0<X<1$)), and a main insulating layer of zirconate titanate in contact with the sub-insulating layer. The sub-insulating layer is located between the semiconductor for a MIS structure and the main insulating layer, and the main insulating layer exhibits ferroelectricity at ordinary temperature.

The inventors of the present invention have carried out research of how a ferroelectric layer exhibiting superior characteristics is formed on a semiconductor substrate. In the formation of the insulating layer of zirconate titanate such as PZT and PLZT, the main key was that the film material could have a perovskite type crystal structure. It was difficult to obtain a film having a perovskite crystal structure just by forming a PZT or a PLZT film directly on a Si substrate. The inventors of the present invention carried out research to find a material that easily provides a perovskite type crystal on a material such as a semiconductor substrate differing greatly in physical properties from PZT and PLZT. As a result, strontium titanate, barium titanate, and barium strontium titanate were found as preferable materials. It was found that a ferroelectric film having a perovskite type crystal structure could be obtained by forming a PZT film or a PLZT film on a thin film of the aforementioned materials. It was considered that the perovskite type structure such as strontium titanate formed on the semiconductor substrate acts as an initial nucleus for PZT or PLZT crystal growth. In other words, it was considered that PZT or PLZT can be grown heteroepitaxially with respect to the underlying crystal structure.

In the present invention, silicon, particularly a p type or an n type Si (100) monocrystalline substrate and Si (111) monocrystalline substrate are preferably used as the semiconductor. For the semiconductor, other IV group semiconductors such as Ge, III–V group compound semiconductor such as GaAs, or II–VI group compound semiconductor such as InP may be used. Strontium titanate, barium titanate, barium strontium titanate, or a combination thereof easily forms a perovskite type crystal on a semiconductor substrate. In a MIS structure, the sub-insulating layer generally has a perovskite type crystal structure. From the standpoint of achieving easily a perovskite type crystal structure on a Si substrate, strontium titanate is preferable among these materials. The sub-insulating layer can be formed with a thickness of approximately 100–500 Å, for example.

In the present invention, a compound represented by the following chemical composition is preferably used as zirconate titanate forming the main insulating layer.

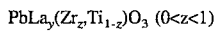

$PbLa_y(Zr_zTi_{1-z})O_3$ (0<z<1)

The above formula represents, when y=0, lead zirconate titanate (PZT), and when y≠0, lanthanum lead zirconate titanate (PLZT). In the above formula, y can preferably be 0 or in the range of 0.03–0.1. Also, a compound having z of 0.5 or in the range of 0.65–0.7 is more preferable.

As zirconate titanate, iron lead titanate zirconate (PFZT) having a portion of Pb in PZT substituted by Fe, manganese lead titanate zirconate (PMZT) having a portion of Pb in PZT substituted by Mn may be used. Zirconate titanate includes complexed salts of zirconate and titanate. The thickness of the main insulating layer is within the range of approximately 1000–1500 Å, for example.

An electrode layer for a MIS structure can be formed of Pt, Al, Al alloy such as AlSi, Ti, Ti alloy such as TiSi, W, W alloy such as WSi, Cu, polysilicon, or a combination thereof. In a MIS structure, the sub-insulating layer may be formed directly on the semiconductor substrate, or may have another film therebetween. When a sub-insulating layer is formed on a semiconductor substrate with another film therebetween, a silicon oxide film, a silicon nitride film, an oxide nitride film, a $TiO_2$ film, a $Ta_2O_5$ film or a combination thereof may be used as the intervening film.

A method of manufacturing an electronic device having a MIS structure includes the steps of preparing a semiconductor portion for a MIS structure, forming a first insulating layer on a semiconductor portion, forming a second insulating layer of zirconate titanate on the first insulating layer, and forming an electrode layer for a MIS structure. The step of forming the first insulating layer includes the step of forming an insulating layer consisting essentially of at least a titanate selected from the group consisting of strontium titanate ($SrTiO_3$), barium titanate ($BaTiO_3$) and barium strontium titanate ($Ba_xSr_{1-x}TiO_3$ ($0<X<1$)). The second insulating layer is formed on the insulating layer consisting essentially of the titanate. The step of forming the first insulating layer may include the step of forming on the semiconductor substrate a silicon oxide film, a silicon nitride film, a nitride oxide film, a $TiO_2$ film, a $Ta_2O_5$ film or a combination thereof, if necessary. The titanate film can be formed on such a film. The insulating layer consisting essentially of the titanate can be formed by a liquid phase method such as sol-gel method, PVD such as sputtering, or CVD such as MOCVD. This insulating layer can be formed with a thickness of approximately 100– 500 Å, for example, by this method. Similarly, the layer consisting essentially of zirconate titanate such as PZT or PLZT can be formed by a liquid phase method such as sol-gel, PVD such as sputtering or CVD such as MOCVD. This layer can be formed with a thickness of approximately 1000–1500 Å, for example, by one of these methods.

In forming the insulating layer of titanate by sputtering, a ceramic sintered product can preferably be used having a stoichiometric composition for strontium titanate, barium titanate, or barium strontium titanate as a sputter target. In forming the second insulating layer, a ceramic sintered product can preferable be used as a target having a stoichiometric composition for lead zirconate titanate or lanthanum lead zirconate titanate. As a sputtering gas, a mixed gas of Ar and $O_2$ is preferably used. The insulating layer of titanate and the second insulating layer can be formed in succession using two types of ceramic sintered products. In sputtering, a substrate for depositing the insulating layer thereon can be heated to 500°–700° C. In deposition of such a high temperature, a film having a perovskite type crystal structure can be obtained as grown. On the other hand, the temperature of the substrate may be set to approximately 300° C. Following a sputtering step at this temperature, a film having a perovskite type crystal structure can be formed by applying annealing at a temperature of 500° C.–700° C. It has been reported that by forming a $SrTiO_3$ film by sputtering on a silicon substrate, a crystallized $SrTiO_3$ layer was formed following a $SiO_2$ layer and an amorphous $SrTiO_3$ layer (Sakuma et al., Applied Phys. Lett. 57, (23), 3 Dec. 1990, pp. 2431–2433). It is described in this document that the dielectric constant of the $SrTiO_3$ layer is not so high.

In forming an insulating layer by CVD, the two insulating layers can be formed in succession using the above described material. In CVD, the above-described β-diketone complex can preferably be used as a Pb source material. As a Zr source material, a Ti source material, and a La source material, zirconium alkoxide, titanium alkoxide, and a β-diketone complex of La can preferably be used, respectively. As a Ba source material, a β-diketone complex of Ba can preferably be used. A preferable β-diketone complex of Ba is bisdipivaloylmethanato barium (Ba $(DPM)_2$). As a Sr source material, a β-diketone complex of Sr can preferably be used. A preferable β-diketone complex of Sr is bisdipivaloylmethanato strontium (Sr $(DPM)_2$).

As described above, strontium titanate, barium titanate, or barium strontium titanate facilitates formation of a perovskite type crystal on a material of a semiconductor substrate differing greatly in physical properties from PZT or PLZT. By forming the insulating layer of zirconate titanate such as PZT or PLZT on the titanate layer, a ferroelectric layer having a perovskite type crystal structure can be obtained. According to such a process, an electronic device having a MFS structure can easily be manufactured.

Strontium titanate, barium titanate, and barium strontium titanate have a higher electrical resistance and superior insulation compared to PZT or PLZT. Therefore, by stacking the titanate layer and zirconate titanate layer, the electrical resistance can be increased in comparison with the usage only of zirconate titanate. A stacked layer structure having a higher electrical resistance is particularly effective as a gate insulating film of a FET because of its leakage current suppression.

Specific embodiments of the present invention will be described hereinafter.

EXAMPLE 1

Regarding an electronic device of the present invention, an embodiment of a capacitor structure (for example, the capacitor portion in a semiconductor device) is shown in FIG. 7. Referring to FIG. 7, a sub-insulating layer of lead titanate is formed on a lower electrode 21 of a noble metal such as platinum, gold, palladium, ruthenium, or rhodium. A main insulating layer 23 of PZT is formed on sub-insulating layer 22. An upper electrode 24 of platinum, titanium nitride, aluminum, tungsten or copper is formed on main insulating layer 23.

Such a structure can be formed as follows. FIG. 8 schematically shows a CVD apparatus for forming two insulating layers of the above-described structure. A substrate 4 for forming a thin film is mounted on a susceptor 20 in a reaction chamber 6 for CVD. An infrared heater 5 is provided in reaction chamber 6 for heating the substrate. Reaction chamber 6 is evacuated by a vacuum pump 7 including a rotary pump 7a and a mechanism booster pump 7b. Reaction chamber 6 is connected to a supplying apparatus of oxygen or ozone via a piping system including a valve 10j and the gas flow controller 11c. Reaction chamber 6 is also connected to tanks 1, 2, 3 and 14 storing source materials via a piping system. Tank 1 storing a Pb source material is connected to an $N_2$ supplying apparatus 8a via a piping system having a gas flow controller 11a. Tank 1 is connected to a nozzle 18 of reaction chamber 6 via a piping system including a valve 10a. A bypass including a valve 10b is provided between the piping system supplying $N_2$ and the piping system supplying the Pb source material. Similarly, tank 2 storing a Zr source material is connected to an $N_2$ supplying apparatus 8b via a valve 10f and a gas flow controller 11b, and to nozzle 18 via a valve 10d. A bypass including a valve 10e is similarly provided. Tank 3 for storing a Ti source material is connected to an $N_2$ supplying apparatus 8c via a valve 10i and a gas flow controller 11d, and also to nozzle 18 via a valve 10g. A bypass including a valve 10h is similarly provided. Tank 14 for supplying a La source material is connected to nozzle 18 of reaction chamber 6 via a piping system including a valve 10k and to an $N_2$ supplying apparatus 8d via a piping system including a valve 10m and a gas flow controller 11e. Similar to other material supplying systems, a bypass including a valve 10n is provided. The piping system extending from the respective tanks of 1, 2, 3 and 14 come together at nozzle 18. The piping system for supplying the materials can be heated by a ribbon heater 19.

In the above-described CVD apparatus, the insulating layer is formed on the lower electrode. In reaction chamber 6, a substrate provided with a lower electrode formed of platinum, for example, is placed. Lead dipivaloylmethanato of at least 99.5% in purity is stored in tank 1 and maintained at 120° C.–140° C., preferably at 135° C. Zirconium tetra tert-butoxide (Zr (O—t—$C_4H_9$)$_4$) of 99.99% in purity is stored in tank 2 and maintained at the temperature of 30° C.–50° C., preferably 30° C. Titanium tetra isopropoxide (Ti (O—i—$C_3H_7$)$_4$) of 99.999% in purity is stored in tank 3 and maintained at the temperature of 30° C.–50° C., preferably 30° C. Although a fourth material is not used in the formation of the above-described structure, tridipivaloylmethanato lanthanum (La (DPM)$_3$), for example, may be stored in tank 14 and maintained at the temperature of 175° C.–180° C. These materials are commercially available.

In the formation of the insulating layer, the pressure in reaction chamber 6 is reduced to the level of 10 Torr by vacuum pump 7a. Substrate 4 is heated to the temperature of 650° C. by infrared heater 5. Valves 10c and 10i *are opened to introduce* $N_2$ gas from $N_2$ supplying apparatuses 8a and 8c. By opening valves 10a and 10g here, the material source in each tank is evaporated and transported to reaction chamber 6 by the $N_2$ carrier gas. Simultaneously, an oxygen gas (such as of semiconductor grade) or an ozone gas (ozone concentration 50–95 g/Nm$^3$) are supplied to reaction chamber 6 via valve 10j. The flow of the carrier $N_2$ gas is adjusted to 50–200 sccm by gas flow controllers 11a, 11b and 11d including mass flow controller or a flow meter. The flow of the oxygen gas or the gas including ozone is adjusted to 500–2000 sccm, typically 1000 sccm, by gas flow controller 11c including a mass flow controller or a flow meter. The material supplying systems are maintained at 50° C.–200° C. by ribbon heater 19. The two source material gases are mixed before reaching reaction chamber 6. The mixed gas is blown via nozzle 18 onto substrate 4 heated to 650° C. The mixed source gas is mixed and oxidized with oxygen or ozone in reaction chamber 6. As a result, an oxide (lead titanate) is formed on a platinum electrode at the deposition rate of approximately 100 Å/min. The vacuum in reaction chamber 6 during deposition is 2–100 Torr, typically 10 Torr. The film thickness can be adjusted by changing the deposition time. After the lead titanate layer of approximately 100 Å in thickness is formed during several ten seconds, the Zr material source stored in tank 2 is supplied to form an insulating layer of PZT on the lead titanate layer. Zirconium tetra tert-butoxide stored in tank 2 is maintained at 30° C.–50° C., preferably 30° C. Following the formation of the lead titanate layer, the three material sources are gasified in succession to be transported to reaction chamber 6 by a $N_2$ carrier gas. Simultaneously, oxygen gas or ozone gas is supplied to reaction chamber 6 via valve 10j. The mixed source gas is mixed with oxygen or ozone in reaction chamber 6 and oxidized. The evaporation condition of a PZT layer is as follows.

Carrier $N_2$ gas flow; Pb source material: 120 sccm, Zr source material: 200 sccm, Ti source material: 60 sccm, oxygen or ozone flow rate: 1000 sccm, pressure in reaction chamber: 10 Torr, substrate temperature: 650° C.

A PZT layer of 1500 Å in thickness formed on the lead titanate layer is confirmed to be a polycrytal having a perovskite type crystal structure by an X-ray diffraction. The dielectric constant of the formed PZT layer is 1000–2000.

By reducing the temperature of the substrate of the above-described conditions, a low temperature CVD process can be achieved. This will reduce thermal damage of the substrate and suppress evaporation of Pb from the formed thin film. For example, by setting the flow rates of the carrier gas for the source materials of Pb, Zr and Ti to 150, 187.5, and 62.5 sccm, respectively, and the flow rate of oxygen to 850 sccm, a PZT layer was formed by CVD with various substrate temperatures of 700° C., 675° C., 650° C. and 625° C. under the pressure of 2 Torr. The composition of the obtained PZT is shown in Table 1.

TABLE 1

| Substrate temperature (°C.) | PZT composition (Pb/Ti ratio) |
|---|---|
| 700 | 50/50 |
| 675 | 57/43 |
| 650 | 68/32 |
| 625 | 76/24 |

It can be appreciated from Table 1 that a Pb rich PZT layer can be formed by reducing the substrate temperature.

The substrate is then unloaded from the CVD apparatus, and an electrode is formed on the dielectric layer according to a sputtering method and the like. As a result, a capacitor having the structure as shown in FIG. 7 is obtained.

As described above, the capacitor of FIG. 7 has the two insulating layers manufactured in succession and easily by switching only the gas using the same CVD apparatus.

In the capacitor shown in FIG. 7, an insulating layer of lanthanum lead titanate can be formed instead of the insulating layer of lead titanate. A layer of lanthanum lead titanate can be formed using a source material of lanthanum together with the source materials of titan and lead in the above-described CVD step.

Also, an insulating layer of PLZT can be formed instead of the insulating layer of PZT. The PLZT layer can be formed using the source materials of lead, titanium, zirconium and lanthanum according to the above-described CVD method.

EXAMPLE 2

A capacitor structure (for example, the capacitor portion of a semiconductor device) in an electronic device according to another embodiment of the present invention is shown in FIG. 9. Referring to FIG. 9, a sub-insulating layer 32 of strontium titanate, barium titanate, barium strontium titanate, or a combination thereof is formed on a lower electrode 31 of a noble metal such as platinum, gold, palladium, ruthenium or rhodium. A main insulating layer 33 of PZT or PLZT is formed on sub-insulating layer 32. An upper electrode 34 of platinum, titanium nitride, aluminium, tungsten or copper is formed on main insulating layer 33.

Figure 10:
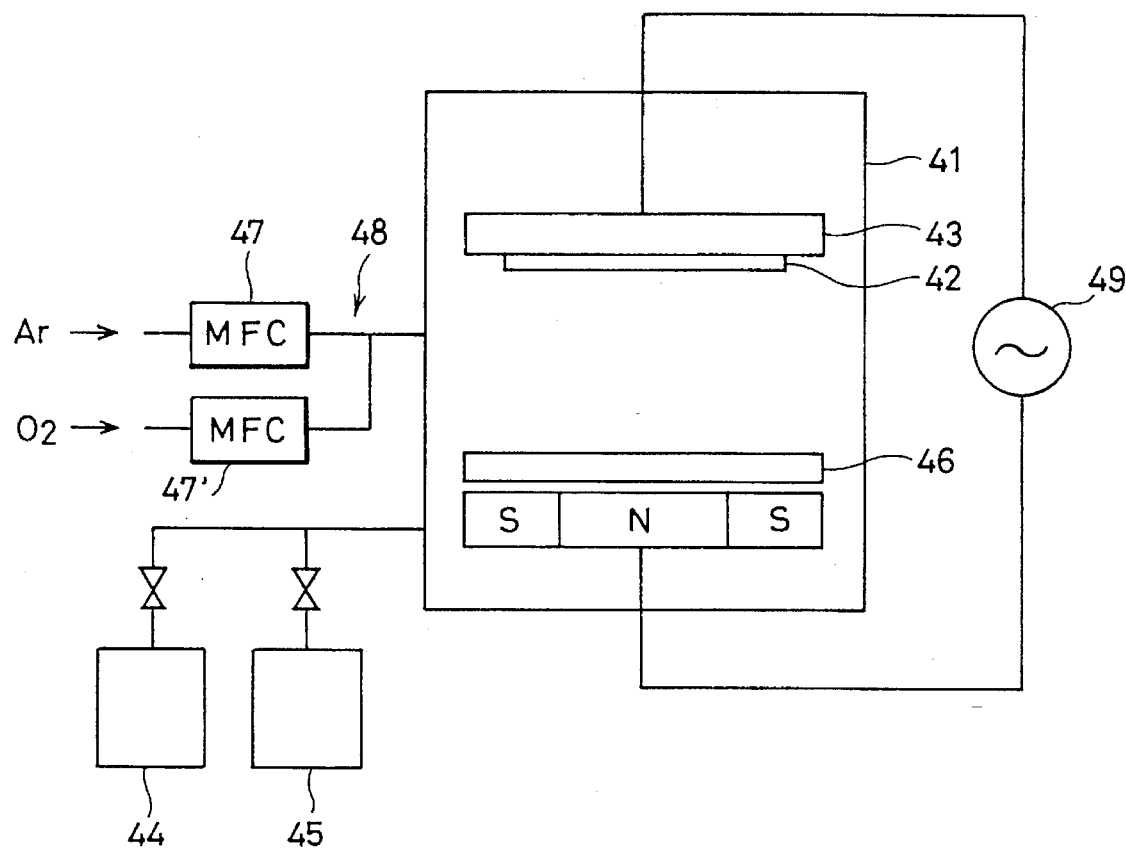
FIG. 10 schematically shows a sputtering device for manufacturing an insulating layer according to the present invention.
Figure 11:
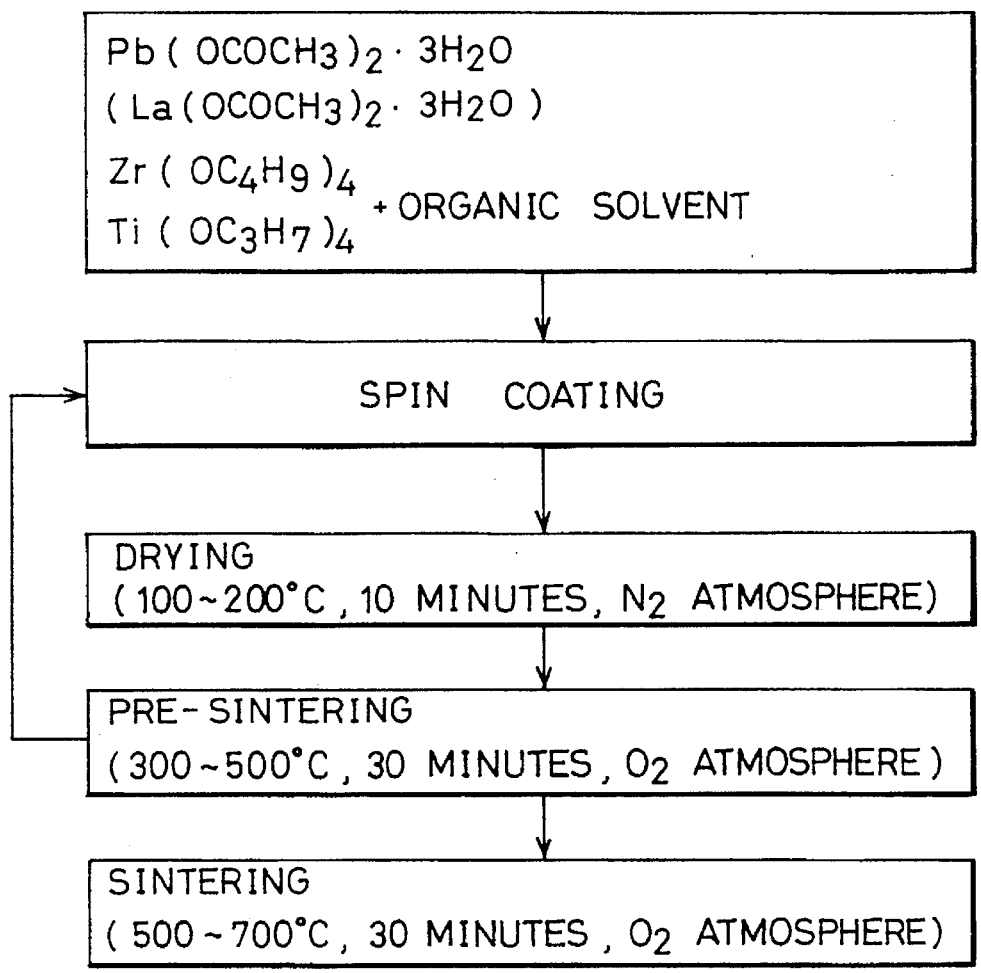
FIG. 11 shows the flow of manufacturing a PZT or PLZT layer by a sol-gel method according to the present invention.

The above-described structure is formed as follows. FIG. 10 schematically shows a sputtering apparatus for forming the sub-insulating layer of the above-described structure. Referring to FIG. 10, a substrate 42 for forming a thin film thereon is attached to a susceptor 43 in a reaction chamber 41. Substrate 42 is heated to 400°–700° C., preferably 500° C.–600° C. by resistance heating. Reaction chamber 41 is exhausted by a rotary pump 44 and a cryopump 45. A ceramic sintered product having a stoichiometric composition can be used as a target material 46. As the ceramic sintered product, a material of the composition ratio of $SrTiO_3$, $BaTiO_3$ or $Ba_YSr_{1-Y}TiO_3$ (0<Y<1) are respectively used. Argon or oxygen gas is supplied to reaction chamber 41 via a piping system 48 including gas flow controllers 47 and 47'. Although the composition of the gas is variable by controlling the flow rate, the Ar/$O_2$ ratio is preferably within the range of 5/1–9/1. A high frequency wave of 13.56 MHz is applied between substrate 42 and target 46 by a high frequency power source 49. The input power within the range of 200–1 kW is used. The distance between substrate 42 and target 46 is 50–100 mm. According to the above-described film growing conditions, an insulating layer of strontium titanate, barium titanate, or barium strontium titanate can be formed with a thickness of 500–1000 Å in 15–30 minutes. Then, an insulating layer of PZT or PLZT is formed. A sol-gel method according to the flow shown in FIG. 11 can be used to form this insulating layer. In forming a PZT layer, a sol-gel solution containing lead acetate, zirconium tetrabutoxide and titanium tetraisopropoxide dissolve in an organic solvent can be used. In forming a PLZT layer, lanthanum acetate is additionally added to the materials. Referring to FIG. 11, the sol-gel solution is spin coated on the insulating layer formed by sputtering, followed by a drying step, and a pre-sintering step to obtain a film of approximately 500 Å in thickness. As indicated in FIG. 11, drying is carried out under $N_2$ atmosphere for 10 minutes at the temperature of 100° C.–200° C. Pre-sintering is carried out under $O_2$ atmosphere for 30 minutes at the temperature of 300°–500° C. By repeating 4–5 times the process of spin coating to pre-sintering, a film of a desired thickness can be obtained. By sintering the obtained film in $O_2$ atmosphere for 30 minutes at 500° C.–700° C., a PZT or PLZT film is obtained.

A PZT or a PLZT film can be formed also by CVD. Details of CVD are as shown in Example 1.

Thus, the PZT or PLZT film formed on the insulating layer of strontium titanate, barium titanate, or barium strontium titanate has a polycrystal of a perovskite type crystal structure. Then, the substrate is unloaded from the CVD device, and an electrode is formed on the insulating layer by sputtering or the like. As a result, the capacitor having the structure shown in FIG. 9 is obtained.

EXAMPLE 3

Figure 12:
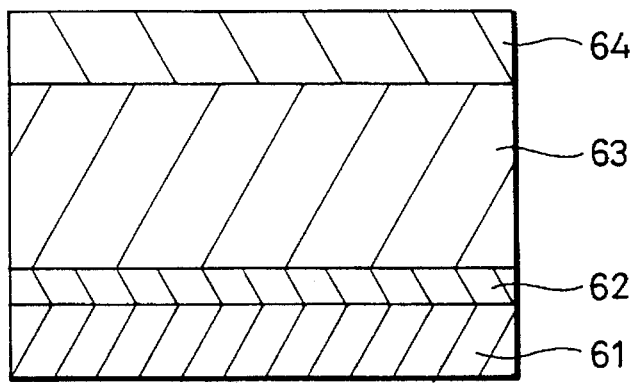
FIG. 12 is a sectional view of a capacitor structure in an electronic device according to a further embodiment of the present invention.

A capacitor structure (for example, the capacitor portion of a semiconductor device) of an electronic device according to a further embodiment of the present invention is shown in FIG. 12. Referring to FIG. 12, a sub-insulating layer 62 of lead zirconate or lead lanthanum zirconate is formed on a lower electrode 61 of a noble metal such as platinum, gold, palladium, ruthenium, or rhodium. A main insulating layer 63 of PZT or PLZT is formed on sub-insulating layer 62. An upper electrode 64 of platinum, titanium nitride, aluminium, tungsten or copper is formed on main insulating layer 63.

The insulating layer of lead zirconate or lanthanum lead zirconate can be formed according to the above described CVD, sputtering, or sol-gel method. Similarly, the insulating layer of PZT or PLZT can be formed by the above-described CVD or sol-gel method. The two insulating layers are sequentially deposited on the lower electrode, and an upper electrode is formed thereupon, whereby a capacitor structure shown in the drawing can be obtained.

EXAMPLE 4

Figure 13:
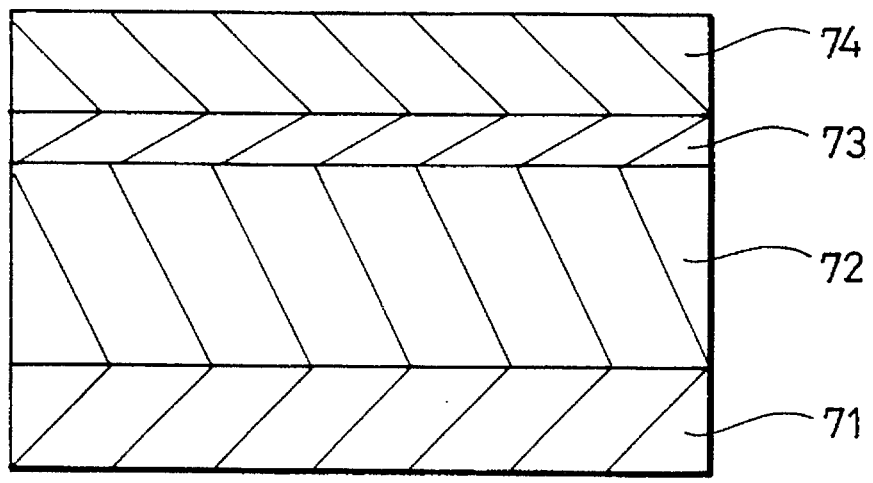
FIG. 13 is a sectional view of a capacitor structure in an electronic device according to still another embodiment of the present invention.

A capacitor structure (for example, the capacitor of a semiconductor device) of an electronic device according to still another embodiment of the present invention is shown in FIG. 13. Referring to FIG. 13, an insulating layer 72 of PZT is formed on a lower electrode 71 of noble metal such as platinum, gold, palladium, rhodium, or ruthenium. An oxide layer 73 of Zr oxide is formed on insulating layer 72. An upper electrode 74 of platinum, titanium nitride, aluminium, tungsten or copper is formed on oxide layer 73.

In the above-described capacitor structure, the insulating layer and the oxide layer can be formed in succession with the same apparatus. A substrate having an electrode of noble metal such as platinum by sputtering is mounted in reaction chamber 6 of the CVD apparatus of FIG. 8. The substrate is heated, followed by formation of a PZT layer thereon similar to the process of Example 1 under the conditions set forth in the following. The material used are similar to those of the above-described embodiment.

Source material vaporization temperature: Pb source material: 135° C., Zr source material: 30° C., Ti source material: 30° C., carrier gas flow rate for each source material: Pb source material: 120 sccm, Zr source material: 200 sccm, Ti source material: 60 sccm, supply rate of oxygen gas or ozone: 1000 sccm, reaction chamber pressure: 10 Torr, substrate temperature: 650° C.

A PZT thin film is formed on the electrode at a deposition rate of 50–200 Å/min. The introduction of the source material and oxygen are temporarily ceased, and the pressure in reaction chamber 6 is reduced to $10^{-3}$ Torr by vacuum pump 7a. Then, only zirconium tetra tert-butoxide together with oxygen is provided to reaction chamber 6 to form a zirconium oxide layer on the PZT under the following conditions.

Source material vaporization temperature: Zr source material: 30° C., carrier gas flow rate with respect to Zr source material: 200 sccm, flow rate of oxygen gas: 1000 sccm, reaction chamber pressure: 10 Torr, substrate temperature: 650° C.

Then, an upper electrode is provided on Zr oxide layer by sputtering or the like.

EXAMPLE 5

Figure 14:
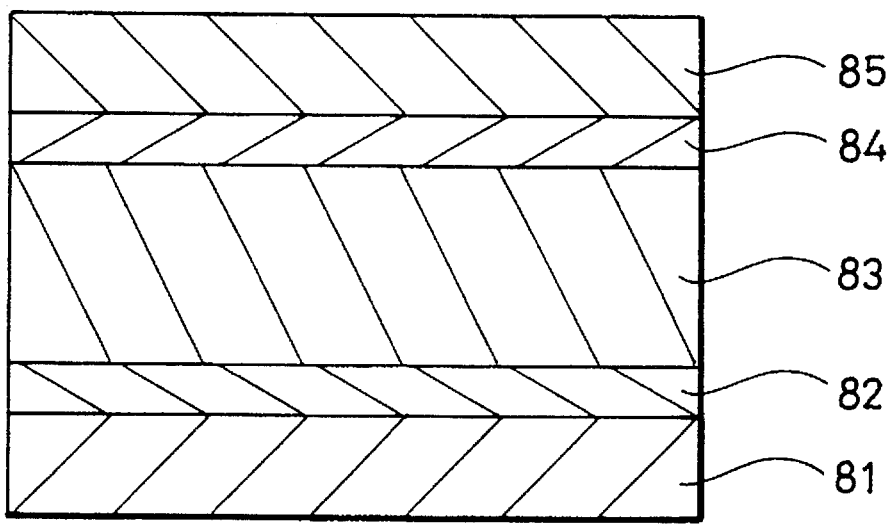
FIG. 14 is a sectional view of a capacitor according to another embodiment of the present invention.

The oxide layer of Example 4 can be applied to the capacitors of Examples 1–3. In this case, the insulating layer of the capacitor has a three layered structure as shown in FIG. 14. On a lower electrode 81, a layer 82 of titanate or zirconate is formed in accordance with Examples 1–3. A PZT or PLZT layer 83 is formed on layer 82. An oxide layer 84 according to Example 4 is formed thereon. An upper electrode 85 is formed on oxide layer 84.

The capacitor structures of Examples 1–5 can be applied to semiconductor devices such as DRAMs and nonvolatile RAMs, and to electronic devices such as piezoelectric, pyroelectric and optoelectric devices. When the capacitor structure of Examples 1–5 is to be applied to a DRAM, a semiconductor memory device according to the present invention can be provided by substituting the capacitor where PZT is sandwiched by two electrodes as shown in FIG. 1 with the capacitor structures of Examples 1–5. Such a semiconductor memory device can be manufactured by substituting the process for providing a PZT layer with the process of forming the laminate structure in the above embodiment.

EXAMPLE 6

Figure 15:
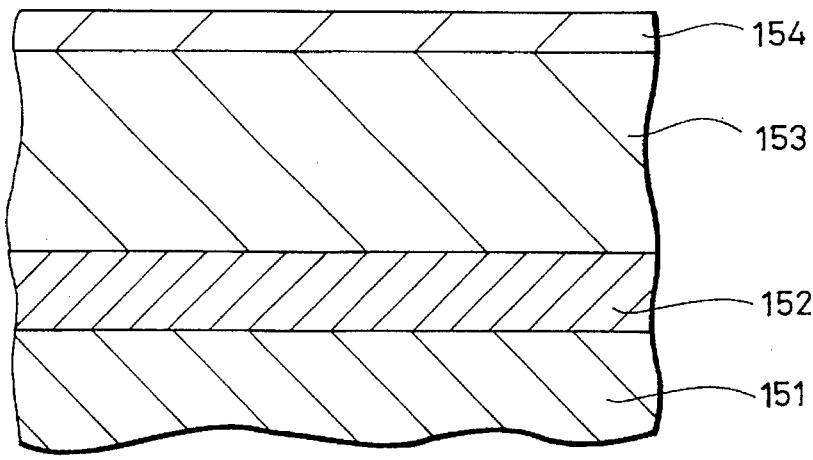
FIG. 15 is a sectional view of a MIS structure according to an embodiment of the present invention.

A MIS structure portion (for example, the gate portion of a transistor in a semiconductor device) of an electronic device according to yet another embodiment of the present invention is shown in FIG. 15. Referring to FIG. 15, a sub-insulating layer 152 of strontium titanate, barium titanate, barium strontium titanate, or a combination thereof is formed on a silicon substrate 151 of a p type or n type silicon (100) monocrystal or silicon (111) monocrystal. A main insulating layer 153 of PZT or PLZT is formed on sub-insulating layer 152. On main insulating layer 153, an electrode 154 of metal such as platinum, aluminium, aluminium alloy, titanium, titanium alloy, tungsten, tungsten alloy or copper, or of a silicon compound such as polysilicon or tungsten silicide is used.

Figure 16:
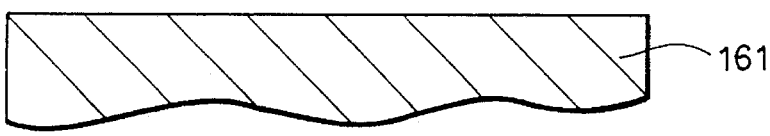
FIGS. 16 (A)–16 (D) are sectional views of a MIS structure according to the present invention showing the formation steps thereof.
Figure 16:
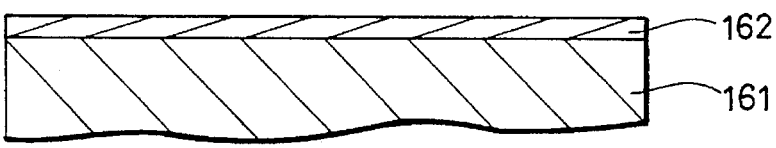
Figure 16:
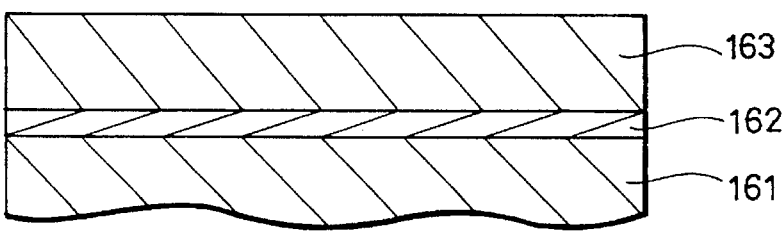
Figure 16:
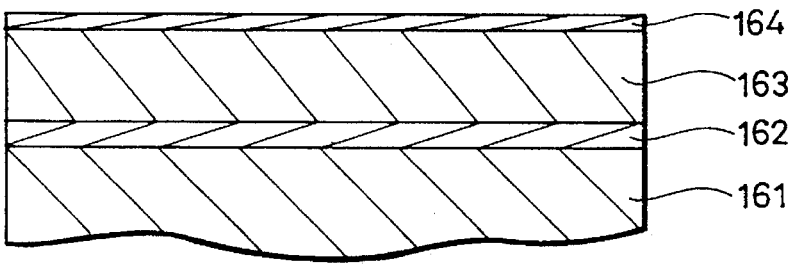

Such a structure can be formed as follows. Referring to FIGS. 16 (A)–16 (D), a silicon substrate 161 as shown in FIG. 16 (A) is prepared. Then, a sub-insulating layer 162 is formed on silicon substrate 161 as shown in FIG. 16 (B). Sub-insulating layer 162 can be formed with the apparatus shown in FIG. 10 similar to Example 2 by a sputtering method. According to film growing conditions similar to those of Example 2, an insulating layer of strontium titanate, barium titanate, barium strontium titanate can be obtained with the thickness of 500–1000 Å during 15–30 minutes. Then, as shown in FIG. 16 (C), a main insulating layer 163 of PZT or PLZT is formed by a sol-gel method. In order to form this insulating layer, a sol-gel method according to the flow shown in FIG. 11 is carried out similar to Example 2. In forming the PZT layer, a sol-gel solution having lead acetate, zirconium tetrabutoxy, and titanium tetrapropoxy dissolved in an organic solvent is used. In forming a PLZT layer, lanthanum acetate is additionally applied to these materials. By spin coating the sol-gel solution onto the sub-insulating layer formed by sputtering, followed by a drying and pre-sintering steps, a film of approximately 500 Å in thickness is obtained. The drying step is carried out under $N_2$ atmosphere for 10 minutes at the temperature of 100°–200° C. The pre-sintering step is carried out under $O_2$ atmosphere for 30 minutes at the temperature of 300°–500° C. By carrying out 4–5 times the process from thin coating to pre-sintering, a film of a desired thickness is obtained. The obtained film is sintered under $O_2$ atmosphere for 30 minutes at 500°–700° C. to result in a PZT film or a PLZT film.

A PZT film or a PLZT film can be formed by CVD similar to Examples 1 and 3. The insulating film of PZT or PLZT is formed by CVD with the thickness of 1000–2000 Å, preferably about 1500 Å.

By forming an electrode layer 164 according to sputtering on the insulating layer formed by the above-described process, a MIS structure is formed as shown in FIG. 16 (D).

Figure 17:
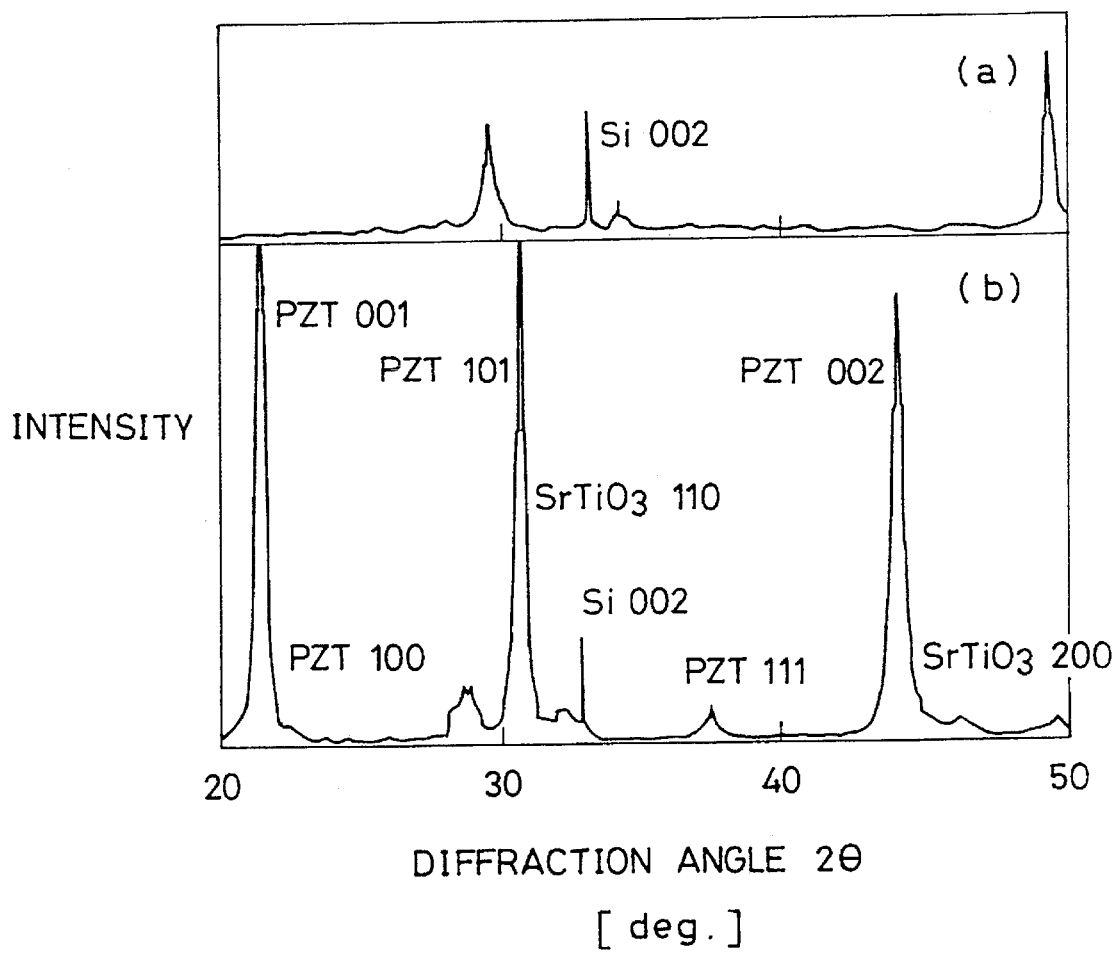
FIG. 17 is a diagram showing an X-ray diffraction pattern of a PZT film formed on a silicon substrate, wherein (a) shows the case of a PZT film formed directly on a silicon substrate, and (b) shows the case of forming a PZT film with a $SrTiO_3$ film thereunder.

An X-ray diffraction pattern is shown in FIG. 17 (b), where a $SrTiO_3$ film and a PZT film are layered on a silicon (002) substrate. An X-ray diffraction pattern is shown in FIG. 17 (a), where a PZT directly deposited on a silicon substrate. The formation process of the insulating layers exhibiting such diffraction patterns are as follows. First, $SrTiO_3$ is deposited at approximately 35 nm in thickness by the above-described sputtering method on a Si substrate. Then, a heating treatment under $O_2$ atmosphere is applied at the temperature of 650° C. to carry out crystal growth of $SrTiO_3$. Then, a PZT layer is formed by CVD on the $SrTiO_3$ film. In forming only a PZT film, a CVD is used. By comparing FIGS. 17 (a) and (b), it is appreciated that the PZT film formed on the strontium titanate film indicates favorable crystallinity. In contrast, the PZT film formed directly on the silicon substrate had almost no crystal structure.

Figure 18A:
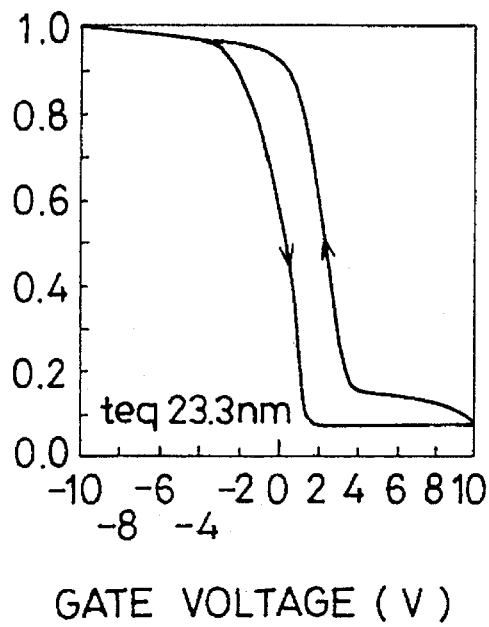
FIG. 18 (A) shows C-V characteristics where a sub-insulating layer and a main insulating layer are formed on a p type silicon substrate.
Figure 18B:
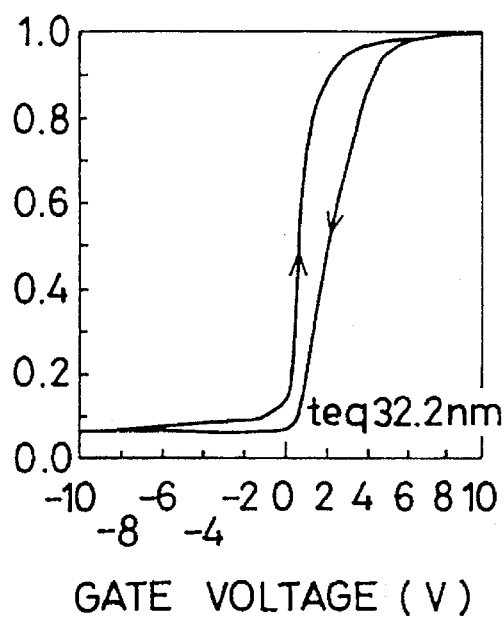

A Pt electrode was provided on the PZT film formed on the strontium titanate film as described above, and C-V characteristics were measured. The results are shown in FIGS. 18 (A) and (B). FIG. 18 (A) shows the C-V characteristics where the two insulating layers are formed on a p type silicon substrate. FIG. 18 (B) shows the C-V characteristics where the two insulating layers are formed on a n-type silicon substrate. It can be appreciated from the drawings that hysterisis loops due to ferroelectricity are observed in both of the n type and the p type.

Figure 19:
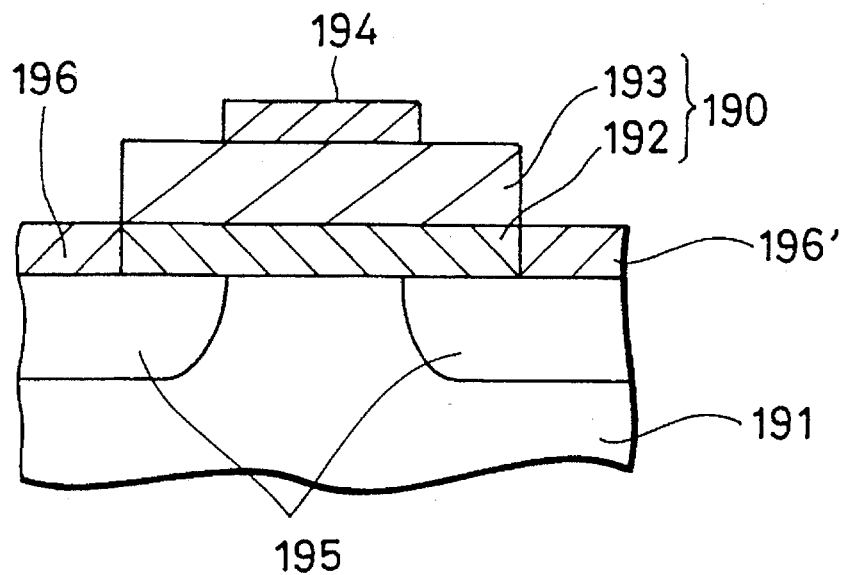
FIG. 19 is a schematic sectional view of a FET according to an embodiment of the present invention.
Figure 20:
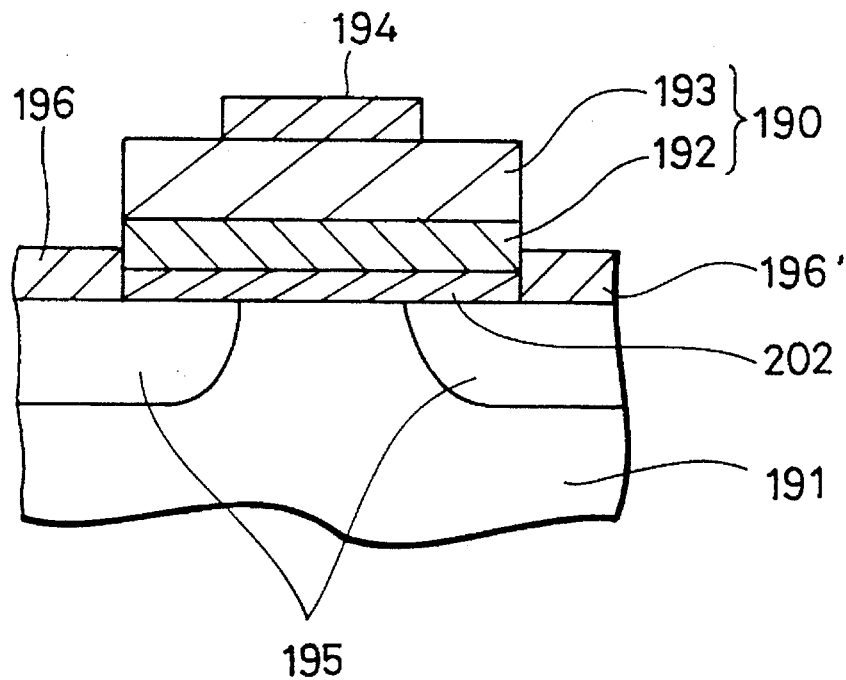
FIG. 20 is a schematic sectional view of FET according to another embodiment of the present invention.

A MFSFET shown in FIGS. 19 and 20 can be manufactured using the above-described process. Referring to FIG. 19, a FET includes a gate insulating film 190 formed on a Si substrate 191. Gate insulating film 190 includes a sub-insulating layer 192 of strontium titanate, barium titanate, or barium strontium titanate, and a main insulating layer 193 of PZT or PLZT formed thereon. A gate electrode 194 is formed on main insulating layer 193. On Si substrate 191, a source/drain region 195 is formed. Electrodes 196 and 196' are provided respectively to contact these regions.

Referring to FIG. 20, a FET has a silicon oxide film 202 between a sub-insulating layer 192 and a substrate 191. Sub-insulating layer 192 is provided on a silicon oxide film 202. The remaining structures are identical to those of the FET shown in FIG. 19. The FET of FIG. 20 may have another insulating film such as silicon nitride film, or an nitride oxide film formed instead of the silicon oxide film.

In the above-described process, the sub-insulating layer can be formed by a sol-gel method or by CVD. The main insulating layer can be formed by sputtering.

This embodiment can be applied to an electronic device having a MFS structure, particularly to a MFSFET.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic device including a MIS structure, wherein said MIS structure comprises:

a silicon layer, a sub-insulating layer formed directly on said silicon layer by CVD or sputtering, and consisting essentially of at least a compound selected from the group consisting of lead titanate, lanthanum lead titanate, barium titanate, strontium titanate, barium strontium titanate, lead zirconate, and lanthanum lead zirconate, a main insulating layer formed directly on said sub-insulating layer by CVD or sputtering, and consisting essentially of zirconate titanate, and a layer formed on said main insulating layer, and consisting essentially of a conductor, wherein said main insulating layer has a perovskite type crystal structure, and exhibits ferroelectricity at ambient temperature, and wherein said sub-insulating layer consists essentially of barium titanate.

2. An electronic device including a MIS structure, wherein said MIS structure comprises:

a silicon layer, a film formed directly on said silicon layer, and consisting essentially of a material selected from the group consisting of silicon oxide, silicon nitride, nitride oxide, $TiO_2$ and $Ta_2O_5$, a sub-insulating layer formed directly on said film by CVD or sputtering, and consisting essentially of at least a compound selected from the group consisting of lead titanate, lanthanum lead titanate, barium titanate, strontium titanate, barium strontium titanate, lead zirconate, and lanthanum lead zirconate, a main insulating layer formed directly on said sub-insulating layer by CVD or sputtering, and consisting essentially of zirconate titanate and, a layer formed on said main insulating layer, and consisting essentially of a conductor, wherein said main insulating layer has a perovskite type crystal structure, and exhibits ferroelectricity at ambient temperature, and wherein said sub-insulating layer consists essentially of barium titanate.

3. An electronic device including a capacitor structure, wherein said capacitor structure comprises:

a first electrode consisting essentially of noble metal, a sub-insulating layer formed directly on said first electrode by CVD or sputtering, and consisting essentially of at least a compound selected from the group consisting of lead titanate, lanthanum lead titanate, barium titanate, strontium titanate, barium strontium titanate, lead zirconate, and lanthanum lead zirconate, a main insulating layer formed directly on said sub-insulating layer by CVD or sputtering, and consisting essentially of zirconate titanate, and a second electrode formed on said main insulating layer, and consisting essentially of a conductor, wherein said main insulating layer has a perovskite type crystal structure, and exhibits ferroelectricity at ambient temperature, and wherein said sub-insulating layer consists essentially of barium titanate.

* * * * *